United States Patent
Chang et al.

(10) Patent No.: US 6,790,524 B2
(45) Date of Patent: Sep. 14, 2004

(54) BIAXIALLY ORIENTED POLYPROPYLENE METALLIZED FILM FOR PACKAGING

(75) Inventors: Keunsuk P. Chang, North Kingstown, RI (US); Michael Narkevicius, Richmond, RI (US); Hiroyuki Kato, East Greenwich, RI (US); Christopher D. Armstrong, North Kingstown, RI (US); Mario A. Scarati, Milan (IT); Enrico Ballico, Marino (IT); Angelo del Lupo, Vasto (IT)

(73) Assignees: Toray Plastics (America), Inc., RI (US); Bimo Italia S.p.A. (IT)

( * ) Notice: Subject to any disclaimer, the term of this patent is extended or adjusted under 35 U.S.C. 154(b) by 148 days.

(21) Appl. No.: 09/921,322

(22) Filed: Aug. 2, 2001

(65) Prior Publication Data

US 2003/0032750 A1 Feb. 13, 2003

(51) Int. Cl.[7] .......................... B32B 15/08; B32B 27/08
(52) U.S. Cl. ...................... 428/336; 428/332; 428/334; 428/335; 428/461; 428/910
(58) Field of Search .................. 428/332, 334, 428/335, 336, 461, 213, 215, 220, 910

(56) References Cited

U.S. PATENT DOCUMENTS

| | | | |
|---|---|---|---|
| 4,343,852 A | * 8/1982 | Isaka et al. .................. 428/216 |
| 5,153,074 A | 10/1992 | Migliorini .................... 428/463 |
| 5,194,318 A | 3/1993 | Miglioini et al. ............. 428/215 |
| 5,366,796 A | * 11/1994 | Murschall et al. ........... 428/216 |
| 5,698,317 A | 12/1997 | Kurokawa et al. .......... 428/349 |
| 5,753,363 A | 5/1998 | Bader et al. ................. 428/331 |
| 5,766,532 A | 6/1998 | Peiffer et al. ............. 264/210.6 |
| 5,851,610 A | * 12/1998 | Ristey et al. ............... 428/34.9 |
| 6,033,786 A | 3/2000 | Fatica et al. ................. 428/461 |
| 6,190,760 B1 | 2/2001 | Nagai et al. ................. 428/213 |

FOREIGN PATENT DOCUMENTS

| | | |
|---|---|---|
| EP | 0 329 336 A2 | 8/1989 |
| EP | 0 645 417 A1 | 3/1995 |
| EP | 0 787 582 A2 | 8/1997 |
| EP | 0 909 638 A2 | 4/1999 |
| EP | 0 925 912 A2 | 6/1999 |
| WO | WO 01/34389 | 5/2001 |
| WO | WO 02/06043 A1 | 1/2002 |

OTHER PUBLICATIONS

Scarati, Mario A., *Polyolefin Films Benefit From Simultaneous Orientation*, McGraw–Hill, Inc., vol. 29, No. 7, Jul. 1999, p. 103–104, 106.

* cited by examiner

Primary Examiner—Monique R. Jackson
(74) Attorney, Agent, or Firm—Piper Rudnick LLP

(57) ABSTRACT

A laminate film comprising a polyolefin polymer layer having a surface treated by a flame or corona discharge treatment method and biaxially oriented at about 5.5–10.0 stretch ratio in the machine direction and about 7.0–12.0 stretch ratio in the transverse direction which imparts superior machine direction tensile properties such as Young's modulus of about 350,000 to about 400,000 psi or greater, elongation of 120% or less, and tensile strength of about 27,000 to about 30,000 psi or greater; and a metal layer having an optical density of at least about 1.8 deposited on said treated surface of said polyolefin-based resin layer.

44 Claims, 1 Drawing Sheet

Film Resistance to MD Elongation

Oxygen Barrier Durability vs. Elongation Force

US 6,790,524 B2

BIAXIALLY ORIENTED POLYPROPYLENE METALLIZED FILM FOR PACKAGING

FIELD OF INVENTION

This invention relates to a metallized polypropylene film exhibiting superior tensile properties, resulting in superior formed bag barrier properties whereby gas and moisture barrier properties are maintained despite high tensions and stresses caused by packaging machinery.

This film has excellent oxygen and moisture barrier, and superior formed bag oxygen and moisture barrier properties.

BACKGROUND OF INVENTION

A biaxially oriented polypropylene metallized film used for packaging applications often performs multiple functions. It must perform in a lamination to provide light, moisture, and oxygen barrier for gas-flush applications; it must provide a heat sealable inner layer for bag forming and sealing; and it must maintain sufficient oxygen and moisture barrier properties after bag-forming and filling in order to retain the benefits of gas-flushing salty snacks such as potato chips.

Typical metallized films used in vertical-form-fill-seal (VFFS) bag makers often demonstrate excellent barrier properties when in unlaminated or laminated form prior to bag-making. However, during the process of bag-forming, due to the wide variety of forming collars used, bag sizes, filling speeds, and machine tensions employed, the laminated structure can be stretched in the machine direction anywhere from 5–10% beyond the normal dimension of the lamination. This elongation during bag-forming can fracture or crack the metal layer of the metallized film, causing a loss of barrier properties, particularly oxygen barrier. Thus, what may have been a metallized film lamination with excellent gas barrier properties prior to bag-forming, may actually result in formed and filled bags with poor gas barrier, thus losing the benefits of the originally designed high gas barrier film.

SUMMARY OF THE INVENTION

The objective of this invention is to solve the aforesaid problems of conventional biaxially oriented polypropylene (BOPP) metallized films by providing a novel BOPP metallized film with exceptionally high tensile properties which in turn, provides greater resistance to the tensions and forces that can be exerted by typical packaging machines. This will result in a metallized high barrier packaging film with excellent formed bag barrier properties. In addition, the film can also offer excellent sealability or slip properties.

According to this invention, the above objective is achieved by a propylene polymer film comprising of at least a single layer extruded film and a vapor-deposited metal layer, with said extruded propylene polymer film exhibiting machine direction tensile properties that are in the range of about 350,000 to about 400,000 psi or higher Young's modulus, about 110% or lower elongation at break (% strain at ultimate), and 27,000 to 30,000 psi or higher tensile strength (stress at ultimate). Such a metallized BOPP film exhibiting these superior tensile properties in the machine direction demonstrates superior resistance to the machine direction stresses and tensions exerted upon it from packaging machines. This superior machine direction resistance then translates into superior barrier properties after bag-forming.

The metallizing surface of said layer is also modified by treatment with a corona discharge or flame treatment method to enhance adhesion and wettability of the vapor-deposited metal; the surface opposite said treated metallizing surface can be treated or left untreated as desired. Additionally, other polyolefin-based resin layers may be coextruded with the primary propylene polymer film layer to enhance metallizing properties and/or, other layers coextruded opposite the metallizing surface to provide sealability or as a winding surface whose surface may also be modified with a corona discharge or flame treatment method to make it suitable for laminating or converter applied adhesives and inks.

DETAILED DESCRIPTION OF THE INVENTION

Figure 1:
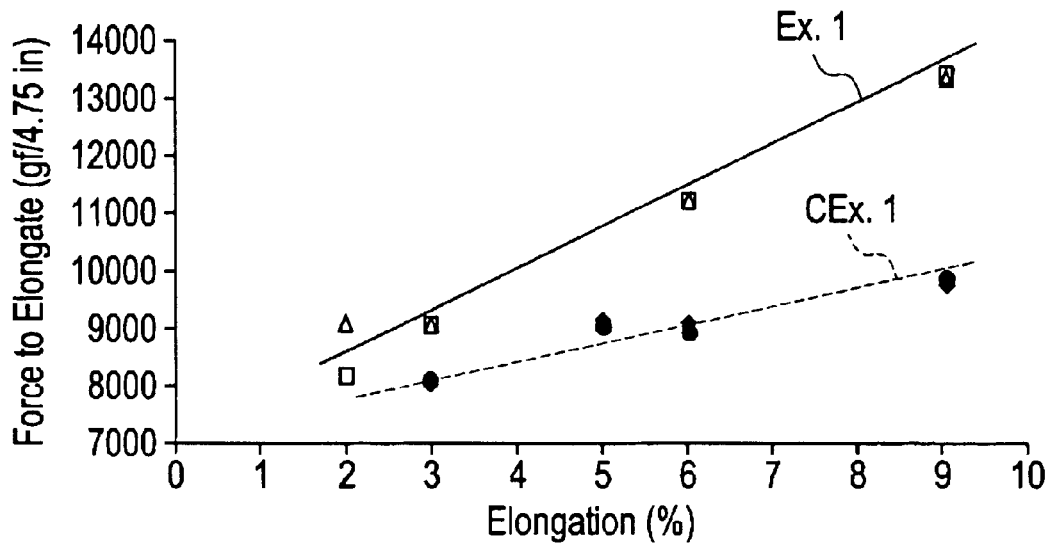
FIG. 1 is a graph showing elongation versus force to elongation for Example 1 and Comparative Example 1.

In one embodiment of the invention the laminate film comprises: a polyolefin resin layer, preferably a resin containing polypropylene; a heat sealable layer or a non-heat sealable, winding layer; and a metal layer. The polyolefin resin layer will have a thickness of about 6 to 40 μm thick. The polyolefin resin layer is corona discharge or flame treated, and the metal layer deposited on the treated resin layer.

The metal layer is preferably a vapor deposited metal, more preferably vapor deposited aluminum. The metal layer shall have a thickness between about 5 and about 100 nm, preferably between about 20 and about 80 nm, more preferably between about 30 and about 70 nm; and an optical density between about 1.5 and about 5.0, preferably between about 2.0 and about 4.0, more preferably between about 2.4 and about 3.2.

The heat sealable layer may contain an anti-blocking agent and/or slip additives for good machinability and a low coefficient of friction in about 0.05-about 0.5% by weight of the heat-sealable layer. The heat sealable layer preferably comprise a ternary ethylene-propylene-butene copolymer. If the invention comprises a non-heat sealable, winding layer, this layer comprises a crystalline polypropylene or a matte layer of a block copolymer blend of polypropylene and one or more other polymers whose surface is roughened during the film formation step so as to produce a matte finish on the winding layer. Preferably, the surface of the winding layer is corona discharge- or flame-treated to provide a functional surface for lamination or coating with adhesives and/or inks.

The polyolefin resin is coextruded with the heat sealable layer which has a thickness between about 0.2 and about 5 μm, preferably between about 0.6 and about 3 μm, and more preferably between about 0.8 and about 1.5 μm. The two layer laminate sheet is cast onto a cooling drum whose surface temperature is controlled between about 20° C. and about 60° C. to solidify the non-oriented laminate sheet.

The non-oriented laminate sheet is stretched in the longitudinal (machine) direction at about 130 to 180° C. at a stretching ratio of preferably about a minimum of 5.5 to about 10 times the original length, and more preferably between about 6 and about 7 times the original length. The sheet is also stretched in the transverse direction at about 130 to about 180° C. at a stretch ratio of about 7 to about 12 times the original length and then heat set to give a biaxially oriented sheet. The superior machine direction tensile properties of the biaxially oriented polypropylene film is imparted by said high machine direction stretching ratios of about 5.5 or greater. The biaxially oriented film has a total thickness between about 6 and about 40 µm, preferably between about 10 and about 20 µm, and most preferably between about 12 and about 18 µm. The stretching process itself may be done by either sequential orientation (machine direction stretching followed by transverse stretching), or by simultaneous orientation (machine and transverse direction stretching performed simultaneously). For practical purposes and high productivity of producing BOPP films with machine direction stretch ratios of minimum 5.5 and greater, those skilled in the art will appreciate that the simultaneous orientation process equipment as developed by Bruckner Maschinenbau GmbH's (LISIM® technology), aids greatly in the production of such highly oriented BOPP coextruded films.

The surface of the polyolefin resin layer of the biaxially oriented laminate film is subjected to a corona discharge or flame treatment. The treated laminate sheet is then wound into a roll. The roll is placed in a metallizing chamber and the metal is vapor-deposited on the treated polyolefin resin layer surface. The metal film may include titanium, vanadium, chromium, maganese, iron, cobalt, nickel, copper, zinc, aluminum, gold, or palladium, the preferred being aluminum. The metallized film is then tested for oxygen and moisture permeability, optical density, metal adhesion, and film tensile properties, and barrier durability.

This invention will be better understood with reference to the following examples, which are intended to illustrate specific embodiments within the overall scope of the invention but not to limit its scope, which is defined in the appended claims.

EXAMPLE 1

One hundred parts by weight of a crystalline propylene homopolymer resin; 0.0002 parts by weight of a sodium calcium aluminosilicate powder or an amorphous silica having a mean particle diameter of 3 µm, were blended together. The mixture was then extruded and biaxially oriented to form a polyolefin film of 1 µm thickness. This polyolefin layer was coextruded and biaxially oriented with a propylene homopolymer core layer having a thickness 15 µm, and a heat sealable layer opposite the first resin layer having a thickness 1.5 µm. The three layer film was coextruded so as to form a biaxially oriented film having a total thickness of 17.5 µm. The heat sealable layer comprised a ternary ethylene-propylene-butene copolymer containing 4000 ppm of a crosslinked silicone polymer of mean particle diameter of 2 µm by weight of the heat sealable layer. The three-layer film was oriented in the machine direction at 6.5 times its original length and oriented in the transverse direction at 7.5 times its original width. The film was then flame-treated on the first propylene homopolymer layer (the metallizing surface) and wound in roll form. The roll was then metallized by vapor-deposition of aluminum onto the flame-treated surface to an optical density of 2.4. The metallized laminate film was then tested for oxygen and moisture permeability, tensile properties, optical density, metal adhesion, and film barrier durability.

COMPARATIVE EXAMPLE 1

A process similar to Example 1 was repeated except that the film was oriented in the machine direction at 4.5 times its original length and oriented in the transverse direction at 8 times its original width. The results appear in Table 1 which follows.

WORKING EXAMPLE 1

The various properties in the above examples were measured by the following methods:

A) Oxygen transmission rate of the film was measured by using a Mocon Oxtran 2/20 unit substantially in accordance with ASTM D3985. In general, the preferred value was an average value equal to or less than 15.5 $cc/m^2/day$ with a maximum of 46.5 $cc/m^2/day$.

B) Moisture transmission rate of the film was measured by using a Mocon Permatran 3/31 unit measured substantially in accordance with ASTM F1249. In general, the preferred value was an average value equal to or less than 0.155 $g/m^2/day$ with a maximum of 0.69 $g/m^2/day$.

C) Optical density was measured using a Tobias Associates model TBX transmission densitometer. Optical density is defined as the amount of light reflected from the test specimen under specific conditions. Optical density is reported in terms of a logarithmic conversion. For example, a density of 0.00 indicates that 100% of the light falling on the sample is being reflected. A density of 1.00 indicates that 10% of the light is being reflected; 2.00 is equivalent to 1%, etc.

D) Metal adhesion was measured by adhering a strip of 1-inch wide 610 tape to the metallized surface of a single sheet of metallized film and removing the tape from the metallized surface. The amount of metal removed was rated qualitatively as follows:
4.0=0–5% metal removed
3.5=6–10% metal removed
3.0=11–20% metal removed
2.5=21–30% metal removed
2.0=31–50% metal removed
1.5=51–75% metal removed
1.0=76–100% metal removed In general, preferred values ranged from 3.0–4.0.

E) Barrier durability of the film was measured by elongating test specimens with original dimensions of 10" long (MD) by 4.75" wide (TD) in an Instron Tensile tester at various elongation percentages up to 9% elongation. The force to elongate the test specimens at each elongation percentage was recorded using the Instron Tensile tester's load cell. The elongated samples were then measured for barrier properties using Mocon Oxtran 2/20 or Permatran 3/31 units. In general, preferred values of $O_2TR$ (oxygen transmission rate), which is a measurement of the permeation rate of oxygen through a substrate, would be equal or less than 46.5 $cc/m^2/day$ up to 9% elongation and MVTR (moisture vapor transmission rate), which is a measurement of the permeation rate of water vapor through a substrate, would be equal or less than 0.69 $g/m^2/day$ up to 9% elongation.

F) Tensile properties were measured in an Instron Tensile tester. The biaxially oriented films were tested in both the machine direction and transverse directions. Young's Modulus, Elongation (% strain at ultimate), and Tensile Strength (stress at ultimate) was tested substantially in accordance with ASTM D822.

Figure 2:
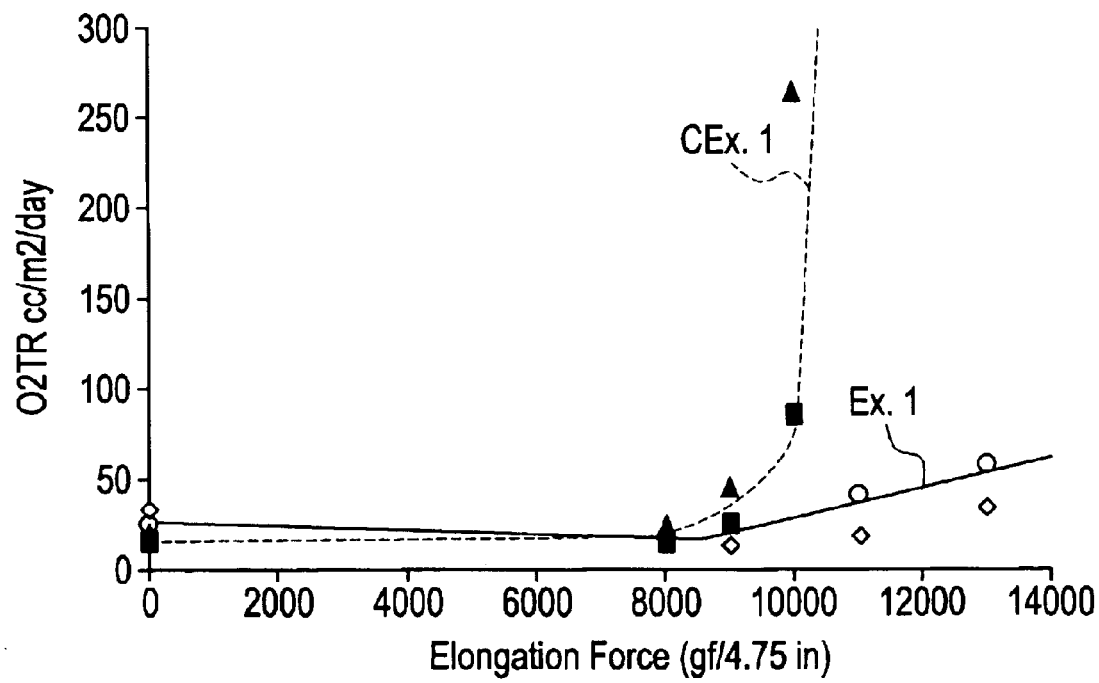
FIG. 2 is a graph showing elongation force versus oxygen barrier durability.

The results of the foregoing examples ("Ex.") and comparative example ("CEx.") are shown in Table 1, and FIGS. 1 and 2.

TABLE I

Comparison of Machine Direction Tensile Properties

|  | CEx. 1* | Ex. 1** |
|---|---|---|
| MD Young's Modulus (psi) | 332,692 | 400,227 |
| MD Elongation (%) | 185 | 107 |
| MD Tensile Strength (psi) | 24,191 | 30,181 |
| Film Thickness (um) | 17.5 | 17.5 |

*produced on sequential orientation
**produced on simultaneous orientation

We claim:

1. A laminate film comprising:
   a) a heat set polyolefin polymer layer having a surface treated by a flame or corona discharge treatment method and biaxially oriented at about 5.5–10.0 stretch ratio in the machine direction and about 7.0–12.0 stretch ratio in the transverse direction, a Young's modulus of about 350,000 or more, elongation of 120% or less, and tensile strength of about 27,000 or more; and
   b) a vapor deposited metal layer having an optical density of at least about 1.8 deposited on said treated surface of said polyolefin-based resin layer.

2. The laminate film of claim 1, further comprising:
   a) a heat sealable polyolefin polymer layer or winding layer comprising at least an anti-block component selected from the group consisting of amorphous silicas, aluminosilicates, sodium calcium aluminum silicate, a crosslinked silicone polymer and polymethylmethacrylate.

3. A laminate film comprising:
   a) a heat set first polyolefin polymer layer having a first surface and a second surface and biaxially oriented at about 5.5–10.0 stretch ratio in the machine direction and about 7.0–12.0 stretch ratio in the transverse direction, a Young's modulus of about 350,000 or more, elongation of about 120% or less, and tensile strength of about 27,000 or more;
   b) a second polyolefin polymer layer disposed on the first surface of said first polyolefin polymer layer having flame or corona discharge-treated surface on said second polyolefin polymer layer disposed on the bide opposite that of the first polyolefin layer;
   c) a vapor deposited metal layer having an optical density of at least about 1.8 deposited on said second polyolefin polymer layer; and
   d) a heat sealable layer or a winding layer disposed on the second surface of said first polyolefin polymer layer.

4. The laminate film according to claim 1, wherein said polyolefin polymer has a thickness of about 6 to about 40 μm.

5. The laminate film of claim 1, wherein said polyolefin polymer layer comprises a polypropylene polymer.

6. The laminate film of claim 2, wherein said heat-sealable layer or winding layer has a thickness of about 0.5 to about 5.0 μm.

7. The laminate film of claim 2, wherein said heat sealable or winding layer comprises an anti-blocking agent of about 0.05 to about 0.5 percent by weight of said heat sealable or winding layer.

8. The laminate film of claim 2, wherein said heat sealable layer comprises a ternary ethylene-propylene-butene copolymer.

9. The laminate film of claim 2, wherein said winding layer comprises a crystalline polypropylene or a matte layer composed of a blend of propylene polymers and one or more other polymers and/or elastomers having a roughened surface.

10. The laminate film of claim 2, wherein said winding layer is treated to provide a surface receptive to lamination or coating with adhesives or inks.

11. The laminate film of claim 1, wherein said metal layer has a thickness of about 5 to about 100 nm.

12. The laminate film of claim 1, wherein said metal layer has an optical density of about 1.8 to about 5.0.

13. The laminate film of claim 1, wherein said metal layer comprises aluminum.

14. The laminate film of claim 3, wherein said second polyolefin resin layer comprises additives that enhance metal adhesion or metal formation.

15. The laminate film of claim 3, wherein said second polyolefin resin layer comprises at least an antiblock component selected from the group consisting of amorphous silicas, aluminosilicates, sodium calcium aluminum silicate, a crosslinked silicone polymer and polymethylmethacrylate.

16. The laminate film of claim 3, wherein said second polyolefin resin layer has a thickness of a out 0.2 to about 5.0 μm.

17. The laminate film of claim 3, wherein said second polyolefin polymer layer comprises a polypropylene polymer.

18. The laminate film of claim 3, wherein said second polyolefin polymer layer comprises a propylene-based copolymer comprising ethylene in amounts of about 0.5 to about 10% ethylene.

19. The laminate film of claim 15, wherein said antiblock component comprises about 0.01 to about 0.5 percent by weight of said second polyolefin polymer layer.

20. The laminate film of claim 14, wherein said second polyolefin layer comprises an additive selected from the group consisting of petroleum hydrocarbon resins and terpene resins.

21. The laminate film of claim 20, wherein the additive comprises about 5 to about 30 percent by weight of said second polyolefin polymer layer.

22. The laminate film of claim 14, wherein said second polyolefin polymer layer comprises an additive selected from the group consisting of linear crystalline polyethylene waxes, branched polyethylene waxes, hydroxyl-terminated polyethylene waxes, and carboxyl-terminated polyethylene waxes.

23. The laminate film of claim 21, wherein said additive comprises about 1 to about 15 percent by weight of said second polyolefin polymer layer.

24. A laminate film comprising:
   a) a heat set polyolefin polymer layer having a flame or corona discharge-treated surface and biaxially oriented at about 5.5—about 10.0 stretch ratio in the machine direction and about 7.0—about 12.0 stretch ratio in the transverse direction which imparts superior machine direction tensile properties such as Young's modulus of about 350,000 or more, elongation of about 120% or less, and tensile strength of about 27,000 or more; and
   b) a vapor deposited metal layer having an optical density of at least about 1.8 deposited on said discharge-treated surface; and wherein
   c) said laminate film has a barrier durability of about 60 cc/m$^2$/day or less oxygen transmission through the laminate film when elongated at about 11,000 g$_f$/4.75" film width elongation force.

25. The laminate film of claim 1, wherein polyolefin polymer layer has a Young's modulus of about 350,000 to about 400,000 psi.

26. A laminate film comprising:
 a) a heat set first polyolefin polymer layer having a first surface and a second surface and biaxially oriented at about 5.5—about 10.0 stretch ratio in the machine direction and about 7.0—about 12.0 stretch ratio in the transverse direction, a Young's modulus of about 350,000 to or more, elongation of about 120% or less, and tensile strength of about 27,000 to about 30,000 psi or more;
 b) a second polyolefin polymer layer disposed on the first surface of said first polyolefin resin layer;
 c) a vapor deposited metal layer having an optical density of at least about 1.8 deposited on said second polyolefin resin layer; and
 d) a heat sealable layer or a winding layer disposed on the second surface of said first polyolefin resin layer;
 e) wherein the laminate film has a barrier durability of about 60 cc/m$^2$/day or less oxygen transmission through the laminate film when elongated at about 11,000 $g_f$/4.75" film width elongation force.

27. The laminate film according to claim 24, wherein said polyolefin polymer layer has a thickness of about 6 to about 40 µm.

28. The laminate film of claim 24, wherein said polyolefin polymer layer comprises a polypropylene resin.

29. The laminate film of claim 25, wherein said heat-sealable layer or winding layer has a thickness of about 0.5 to about 5.0 µm.

30. The laminate film of claim 25, wherein said heat sealable or winding layer comprises an anti-blocking agent of about 0.05 to about 0.5 percent by weight of said heat sealable or winding layer.

31. The laminate film of claim 25, wherein said heat sealable layer comprises a ternary ethylene-propylene-butene copolymer.

32. The laminate film of claim 25, wherein said winding layer comprises a crystalline polypropylene or a matte layer composed of a blend of propylene polymers and one or more other polymers and/or elastomers having a roughened surface.

33. The laminate film of claim 25, wherein said winding layer is treated to provide a surface receptive to lamination or coating with adhesives or inks.

34. The laminate film of claim 24, wherein said metal layer has a thickness of about 5 to about 100 µm.

35. The laminate film of claim 24, wherein said metal layer has an optical density of about 1.8 to about 5.0.

36. The laminate film of claim 24, wherein said metal layer comprises aluminum.

37. The laminate film of claim 26, wherein said second polyolefin polymer layer comprises additives that enhance metal adhesion or metal formation.

38. The laminate film of claim 26, wherein said second polyolefin polymer layer has thickness of about 0.2 to about 5.0 µm.

39. The laminate film of claim 26, wherein said second polyolefin polymer layer comprises a polypropylene polymer.

40. The laminate film of claim 3, wherein said second polyolefin polymer layer comprises a propylene-based copolymer with ethylene in amounts of about 0.5 to about 10% ethylene.

41. The laminate film of claim 37, wherein said second polyolefin polymer layer comprises an additive selected from the group consisting of petroleum hydrocarbon resins and terpene resins.

42. The laminate film of claim 41, wherein the additive comprises about 5 to about 30 percent by weight of said second polyolefin polymer layer.

43. The laminate film of claim 37, wherein said second polyolefin polymer layer comprises an additive selected from the group consisting of linear crystalline polyethylene waxes, branched polyethylene waxes, hydroxyl-terminated polyethylene waxes, and carboxyl-terminated polyethylene waxes.

44. The laminate film of claim 43, wherein the additive comprises about 1 to about 15 percent by weight of said second polyolefin polymer layer.

* * * * *